(12) United States Patent
Gardner et al.

(10) Patent No.: US 11,393,813 B2
(45) Date of Patent: Jul. 19, 2022

(54) METHOD OF ARCHITECTURE DESIGN FOR ENHANCED 3D DEVICE PERFORMANCE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/113,736

(22) Filed: Dec. 7, 2020

(65) Prior Publication Data
US 2021/0366904 A1 Nov. 25, 2021

Related U.S. Application Data

(60) Provisional application No. 63/028,620, filed on May 22, 2020.

(51) Int. Cl.
*H01L 21/8238* (2006.01)
*H01L 27/06* (2006.01)

(52) U.S. Cl.
CPC .. *H01L 27/0688* (2013.01); *H01L 21/823807* (2013.01); *H01L 21/823814* (2013.01); *H01L 21/823835* (2013.01); *H01L 21/823857* (2013.01)

(58) Field of Classification Search
CPC ..... H01L 21/823807; H01L 21/823814; H01L 21/823821; H01L 21/823835; H01L 21/823857
USPC .................................................. 438/154, 156
See application file for complete search history.

(56) References Cited

U.S. PATENT DOCUMENTS 11,158,544 B2 * 10/2021 Cheng ................. H01L 29/4908

* cited by examiner

*Primary Examiner* — Hoai V Pham
(74) *Attorney, Agent, or Firm* — Oblon, McClelland, Maier & Neustadt, L.L.P.

(57) ABSTRACT

Aspects of the present disclosure provide 3D semiconductor apparatus and a method for fabricating the same. The 3D semiconductor apparatus can include a first semiconductor device including first S/D regions, a first gate region sandwiched by the first S/D regions, and a first channel surrounded by the first S/D regions and the first gate region; a second semiconductor device stacked on the first semiconductor device that includes second S/D regions, a second gate region sandwiched by the second S/D regions, and a second channel surrounded by the second S/D regions and the second gate region and formed vertically in-situ on the first channel; and silicide formed between the first and second semiconductor devices where the first and second channels interface and coupled to an upper one of the first S/D regions of the first semiconductor device and a lower one of the second S/D regions of the second semiconductor device.

18 Claims, 12 Drawing Sheets

METHOD OF ARCHITECTURE DESIGN FOR ENHANCED 3D DEVICE PERFORMANCE

INCORPORATION BY REFERENCE

This present disclosure claims the benefit of U.S. Provisional Application No. 63/028,620, "Method of Architecture Design for Enhanced 3D Device Performance" filed on May 22, 2020, which is incorporated herein by reference in its entirety.

FIELD OF THE INVENTION

The present disclosure relates to semiconductor fabrication, and, more particularly, to methods of forming compact semiconductor device designs for 3D fabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes can be executed, such as film-forming depositions, etch mask creation, patterning, material etching and removal, and doping treatments. These processes can be performed repeatedly to form desired semiconductor device elements on a substrate. With microfabrication, transistors can have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of one another.

SUMMARY 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g., a central processing unit (CPU), a graphics processing unit (GPU), a field programmable gate array (FPGA) and a system on chip SoC)) is being pursued.

Aspects of the present disclosure provide a method for fabricating a 3D semiconductor apparatus. In an embodiment, the 3D semiconductor apparatus can include a first semiconductor device and a second semiconductor device. For example, the method can include forming a multilayer stack on a substrate, the multilayer stack including a plurality of layers of at least three different dielectric materials that are capable of being etched selectively with respect to one another. The method can also include forming at least one opening through the multilayer stack down to the substrate such that the substrate is uncovered. The method can also include forming a first channel of a first semiconductor device of the semiconductor apparatus vertically from the uncovered substrate and a second channel of a second semiconductor device of the semiconductor apparatus vertically from the first channel. The method can also include removing a transition dielectric layer of the multilayer stack such that a portion of the first channel and the second channel that interfaces at the transition dielectric layer is uncovered. The method can also include forming a silicide at the uncovered portion to couple the first channel to the second channel. In an embodiment, the method can also include etching the multilayer stack to define sidewall structures of the multilayer stack that are around the first and second channels, wherein removing a transition dielectric layer of the layers of the multilayer stack includes removing a transition dielectric layer of the sidewall structures of the layers of the multilayer stack.

For example, the first and second semiconductor devices are of different types. In an embodiment, the silicide can be formed by depositing salicide metal on the uncovered portion of the first channel and the second channel, and silicidizing the salicide metal with the uncovered portion of the first channel and the second channel. For example, the salicide metal can be selected from the group consisting of Ruthenium (Ru), Cobalt (Co), Titanium (Ti), Tungsten (W), Palladium (Pd), Platinum (Pt) and Nickel (Ni). In an embodiment, the opening can have a rectangular or circular cross-section.

In an embodiment, the method can further include removing gate dielectric layers of the layers of the multilayer stack and replacing with a gate material to form a first gate region of the first semiconductor device and a second gate region of the second semiconductor device. In another embodiment, the first and second gate regions can be formed by removing the gate dielectric layers to uncover the first and second channels, forming a gate dielectric material on the uncover first and second channels, forming a first metal material on the gate dielectric material, forming a second metal material that is surrounded by the first metal material adjacent the first channel, and forming a third metal material that is surrounded by the first metal material adjacent the second channel. For example, at least one of the first and second metal materials can include at least two different metal materials. As another example, the second and third metal materials can include a same metal material. In an embodiment, forming a gate dielectric material can include forming a gate dielectric material on the first and second channel and the multilayer stack.

In an embodiment, the method can further include forming an implant layer on the substrate, wherein the multilayer stack is formed on the implant layer. In another embodiment, forming a first channel of a first semiconductor device of the semiconductor apparatus vertically from the uncovered substrate and a second channel of a second semiconductor device of the semiconductor apparatus vertically from the first channel can include epitaxially growing, within the opening, a first channel material from the implant layer to the transition dielectric layer to form the first channel, and epitaxially growing, within the opening, a second channel material from the transition dielectric layer to top of the multilayer stack to form the second channel. For example, the first channel material and the implant layer can be doped with a same type of dopants.

In an embodiment, the method can further include forming a fourth metal material on the silicide. In another embodiment, the method can further include forming silicide on the multilayer stack, and forming a fifth metal material on the silicide. In yet another embodiment, the method can further include removing second source/drain (S/D) dielectric layers of the layers of the multilayer stack and replacing with a second S/D material to form second S/D regions of the second semiconductor device, and removing first S/D dielectric layers of the layers of the multilayer stack and replacing with a first S/D material to form first S/D regions of the first semiconductor device. For example, the first S/D dielectric layers are capable of being etched selectively with respect to the first S/D dielectric layers.

Aspects of the present disclosure also provide a semiconductor apparatus. For example, the semiconductor apparatus can include a first semiconductor device and a second semiconductor device staked on the first semiconductor device. In an embodiment, the first semiconductor device can include first S/D regions, a first gate region sandwiched by the first S/D regions, and a first channel surrounded by the first S/D regions and the first gate region. In another embodiment, the second semiconductor device can include second S/D regions, a second gate region sandwiched by the second S/D regions, and a second channel surrounded by the second S/D regions and the second gate region and formed vertically in-situ on the first channel. As another example, the semiconductor apparatus can further include silicide. In an embodiment, the silicide can be formed between the first semiconductor device and the second semiconductor device where the first channel interfaces with the second channel and coupled to an upper one of the first S/D regions of the first semiconductor device and a lower one of the second S/D regions of the second semiconductor device.

For example, the first semiconductor device and the second semiconductor device can be of different types. In an embodiment, the first gate region can include a first metal material and a second metal material surrounded by the first metal material, and the second gate region can include the first metal material and a third metal material surrounded by the first metal material. For example, the second and third metal materials can include the same metal material.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 1-9A and 10-17 show cross-sectional views illustrating an exemplary method for fabricating a 3D semiconductor apparatus according to some embodiments of the present disclosure;

DETAILED DESCRIPTION

Figure 1:
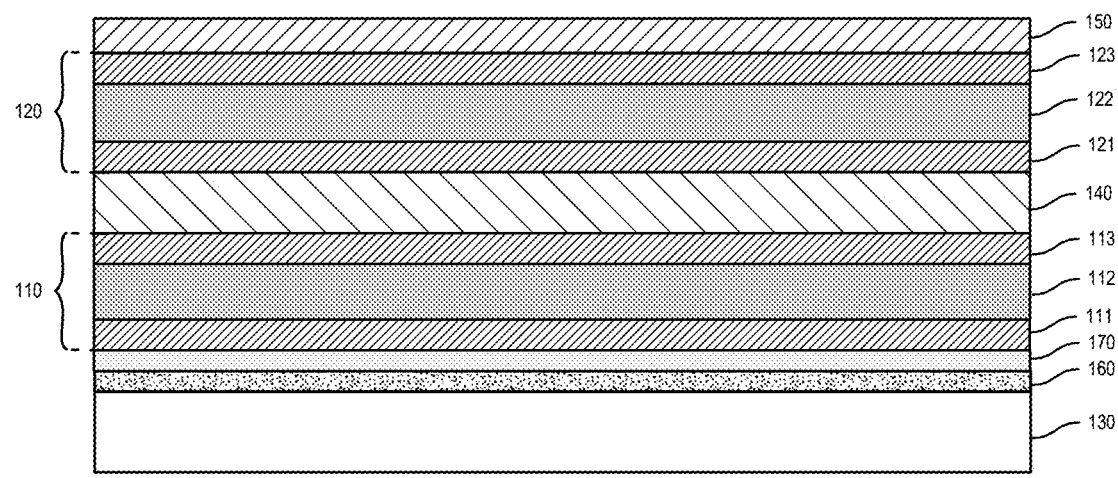

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein can enable 3D stacks of NMOS devices over PMOS devices or vice versa. 360 degree access to transistors can be provided for optimal routing for the gate electrode and source/drain (S/D) regions. Techniques can include a self-aligned 3D 360 degree salicidation region. Examples will be described for inverter applications for two different transistors. Techniques herein can provide a reduction in layout because an entire vertical gate-all-around (GAA) inverter can be formed in one vertical stack. Methods herein can be used for any channel material in which two CMOS 3D transistors or devices have an N+ region connected to a P+ regions through a common salicided region. Because 3D channel and 3D S/D regions are grown vertically, significant device scaling can be achieved with embodiments herein.

Example embodiments will now be described with reference to the drawings. One process flow can describe a method for fabricating a vertical 3D GAA in-situ epi nano device with two transistors. This example flow can use a stack of a first dielectric material layer, a second dielectric material layer and a third dielectric material layer that are all selective to one another. That is, there are one or more etchants and/or etching conditions such that a given one of the dielectrics can be etched without etching (or substantially etching) the other two dielectrics. An example dielectric scheme can include oxide based SiOx, SiOxNy based, high-k based, and High-k OxNy based. With high-k materials, changing an element used with high-k with oxide can cause selectivity also within the different types of high-k. Either wet etch or dry etch can be used. To further enhance selectivity options and combinations of all wet, all dry, or wet and dry also provides more options for a three-material selectivity scheme. The future dielectric region (the third dielectric material layer) can be shown, and between two future transistor regions (e.g., PMOS and NMOS) will be a silicide connection for the channel region of a CMOS inverter. The second dielectric material layer will be a future gate electrode region for the two GAA vertically grown devices. Embodiments herein can use an N+ (N-doped) epitaxially grown material for the source, drain, and channel for NMOS, and then P+ (P-doped) epitaxially grown material for the source, drain, and channel for PMOS as an example. Any compatible materials, however, can also be selected for the channel or S/D regions, as embodiments herein can provide a device and method of fabricating 3D vertically-stacked CMOS devices.

FIGS. 1-9A and 10-17 show cross-sectional views illustrating an exemplary method for fabricating a 3D semiconductor apparatus according to some embodiments of the present disclosure. FIG. 9B shows a schematic view of the 3D semiconductor apparatus of FIG. 9A. In an embodiment, the 3D semiconductor apparatus can include a first semiconductor device and a second semiconductor device. In an embodiment, the method can include forming a multilayer stack on a substrate, the multilayer stack including a plurality of layers of at least three different dielectric materials that are capable of being etched selectively with respect to one another, forming at least one opening through the multilayer stack down to the substrate such that the substrate is uncovered, forming in the opening a first channel of a first semiconductor device of the semiconductor apparatus vertically from the uncovered substrate and a second channel of a second semiconductor device of the semiconductor apparatus vertically from the first channel, removing a transition dielectric layer of the layers of the multilayer stack such that a portion of the first channel and the second channel that interfaces at the transition dielectric layer is uncovered, and forming a silicide at the uncovered portion to couple the first channel to the second channel.

As shown in FIG. 1, a substrate 130 can be provided, a dielectric layer 160 can be formed (e.g., deposited) on the substrate 130, and an implant layer 170 can be formed (e.g., deposited) on the dielectric layer 160. In an embodiment, the implant layer 170 can be doped with a first type (e.g., N-type) of dopants. In another embodiment, the implant layer 170 can be doped with a second type (e.g., P-type) of dopants.

As also shown in FIG. 1, a first dielectric layer stack 110 can be formed on the substrate 130. In an embodiment, the first dielectric layer stack 110 can include a lower source/drain (S/D) dielectric layer 111, a gate dielectric layer 112 formed (e.g., deposited) on the lower S/D dielectric layer 111, and an upper S/D dielectric layer 113 formed (e.g., deposited) on the gate dielectric layer 112. In an embodiment, the dielectric layers 111-113 can be nanosheets. For example, the dielectric layers 111-113 can include oxide bases SiOx, SiOxNy based, high-k based, and high-k OxNy based dielectric materials. In an embodiment, the lower S/D dielectric layer 111 and the upper S/D dielectric layer 113 can include the same dielectric material, e.g., a first dielectric material. In another embodiment, the gate dielectric layer 112 can include a second dielectric material that is capable of being etched selectively with respect to the first dielectric material.

As also shown in FIG. 1, a transition dielectric layer 140 can be formed (e.g., deposited) on the first dielectric layer stack 110. In an embodiment, the transition dielectric layer 140 can include a third dielectric material and be capable of being etched selectively with respect to the lower S/D dielectric layer 111 and the upper S/D dielectric layer 113, which include the first dielectric material, and to the gate dielectric layer 112, which includes the second dielectric material.

As also shown in FIG. 1, a second dielectric layer stack 120 can be formed on the transition dielectric layer 140. In an embodiment, the second dielectric layer stack 120 can include a lower S/D dielectric layer 121, a gate dielectric layer 122 formed (e.g., deposited) on the lower S/D dielectric layer 121, and an upper S/D dielectric layer 123 formed (e.g., deposited) on the gate dielectric layer 122. In an embodiment, the dielectric layers 121-123 can be nanosheets. For example, the dielectric layers 121-123 can include oxide bases SiOx, SiOxNy based, high-k based, and high-k OxNy based dielectric materials. In an embodiment, the lower S/D dielectric layer 121 and the upper S/D dielectric layer 123 can include the same dielectric material, e.g., the first dielectric material. In another embodiment, the gate dielectric layer 122 can be capable of being etched selectively with respect to the lower S/D dielectric layer 121 and the upper S/D dielectric layer 123. For example, the gate dielectric layer 122 can include the second dielectric material. In an embodiment, the first dielectric layer stack 110, the transition dielectric layer 140 and the second dielectric layer stack 120 can be included in a multilayer stack. As also shown in FIG. 1, a hardmask 150 can be formed on the second dielectric layer stack 120.

Figure 2:
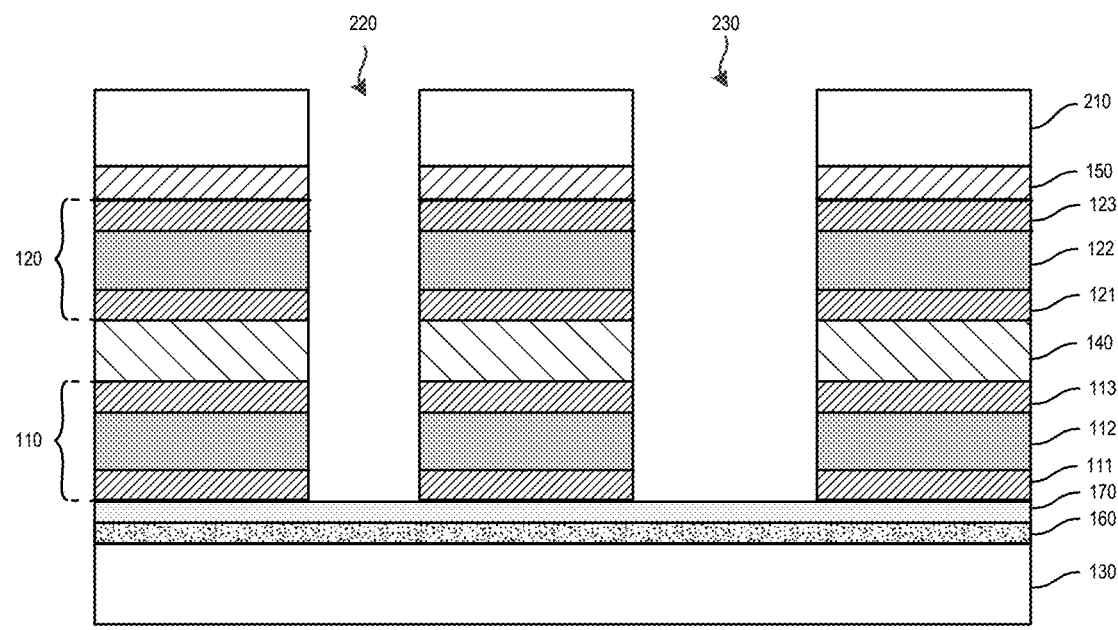

As shown in FIG. 2, a mask 210 can be patterned and formed on the hardmask 150, and the second dielectric layer stack 120, the transition dielectric layer 140 and the first dielectric layer stack 110 can be etched down to the implant layer 170 to form at least one opening. For example, the mask 210 can be a photoresist mask that is patterned by photolithography. In an embodiment, the opening can have a rectangular cross-section. In another embodiment, the opening can have a circular cross-section. In yet another embodiment, two openings 220 and 230 can be formed. For example, the two openings 220 and 230 can have the same size. As another example, the two openings 220 and 230 can have different sizes.

Figure 3:
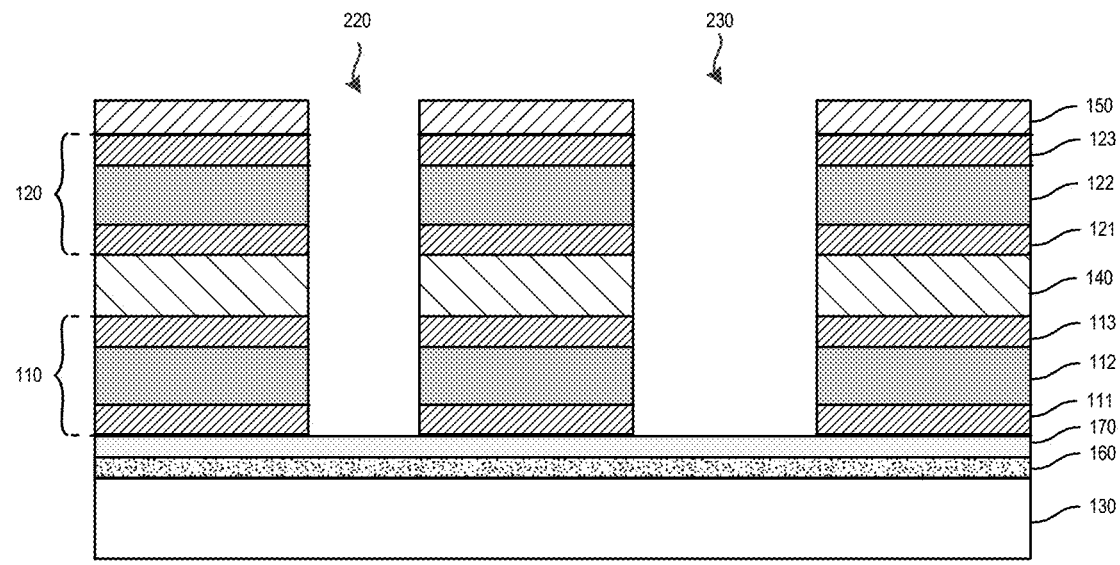

As shown in FIG. 3, the photoresist mask 210 can be removed, showing the second dielectric layer 120, the transition dielectric layer 140 and the first dielectric layer 110 with the openings 220 and 230 formed therethrough.

Figure 4:
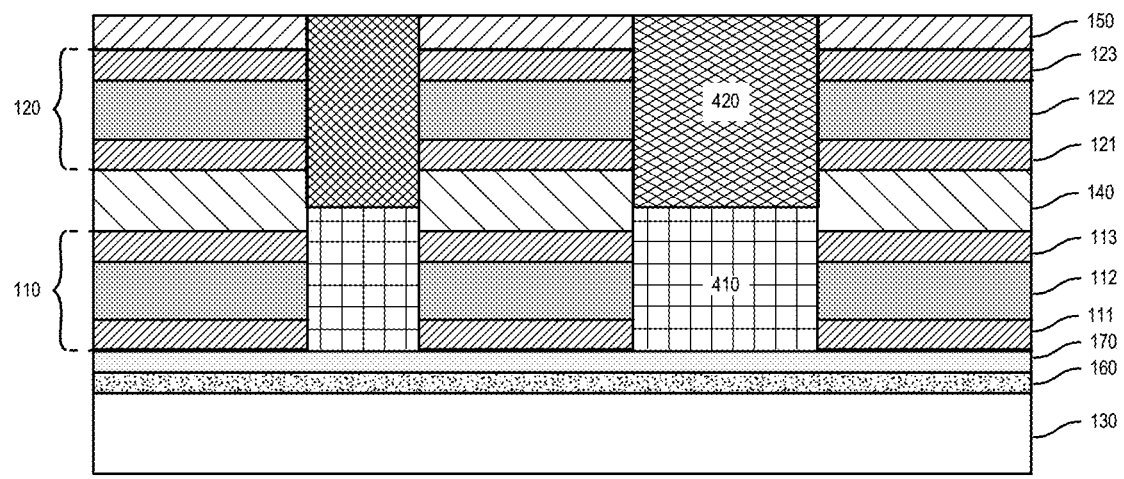

As shown in FIG. 4, the openings 220 and 230 can be filled with channel materials. In an embodiment, the implant layer 170 can be doped with a first type of dopants, a first channel material of a first type can be epitaxially grown from the implant layer 170 to a particular height to form a first channel 410, and then a second channel material of a second type can be exitaxially grown from the particular height to the top of the second dielectric layer stack 120. For example, the first type can be N-type, and the second type can be P-type. As another example, the first type can be P-type, and the second type can be N-type. In an embodiment, at least one of the first and second channel materials can be silicon, germanium, or other semiconductor materials. In another embodiment, the particular height can be from the implant layer 170 to the transition dielectric layer 140 where the first channel 410 interfaces with the second channel 420.

Figure 5:
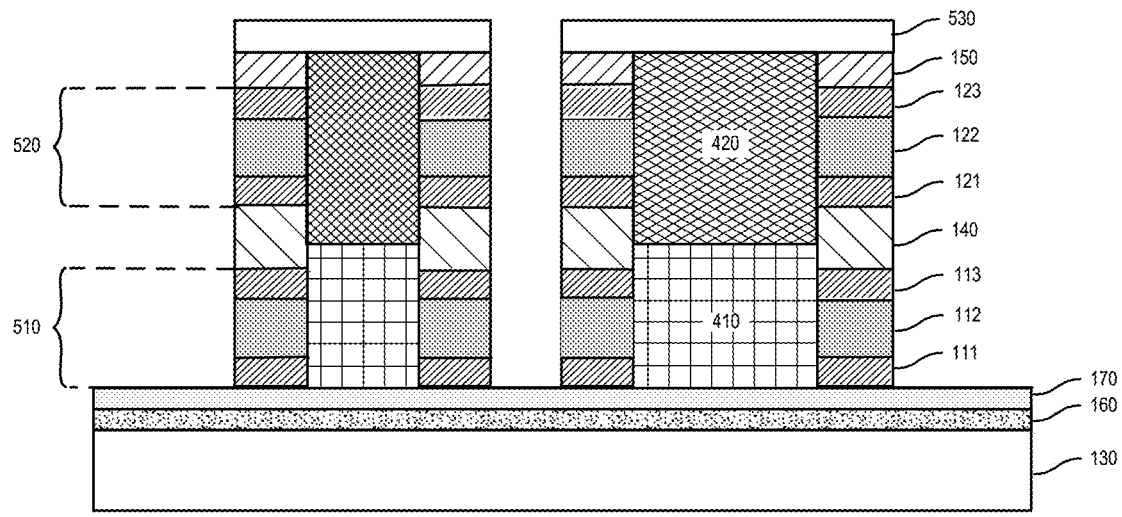

As shown in FIG. 5, another mask 530 (e.g., a photoresist mask) can be patterned and formed on the second dielectric layer stack 120, and the second dielectric layer stack 120, the transition dielectric layer 140 and the first dielectric layer stack 110 can be etched down to the implant layer 170 to uncover a portion of the implant layer 170, to form a future first semiconductor device 510 and a future second semiconductor device 520 stacked vertically in-situ on the first semiconductor device 510. For example, the first semiconductor device 510 can be an NMOS, the second semiconductor device 520 can be a PMOS, and the NMOS 510 and the PMOS 520 can be coupled to each other to form a CMOS inverter. As another example, the first semiconductor device 510 can be a PMOS, the second semiconductor device 520 can be an NMOS, and the PMOS 510 and the NMOS 520 can be coupled to each other to form another CMOS inverter. In an embodiment, the second dielectric layer stack 120, the transition dielectric layer 140 and the first dielectric layer stack 110 can be etched a distance d extending beyond the epi regions so that the first dielectric layer stack 110 and the second dielectric layer stack 120 can form sidewall structures around each of the epi-grown materials.

Figure 6:
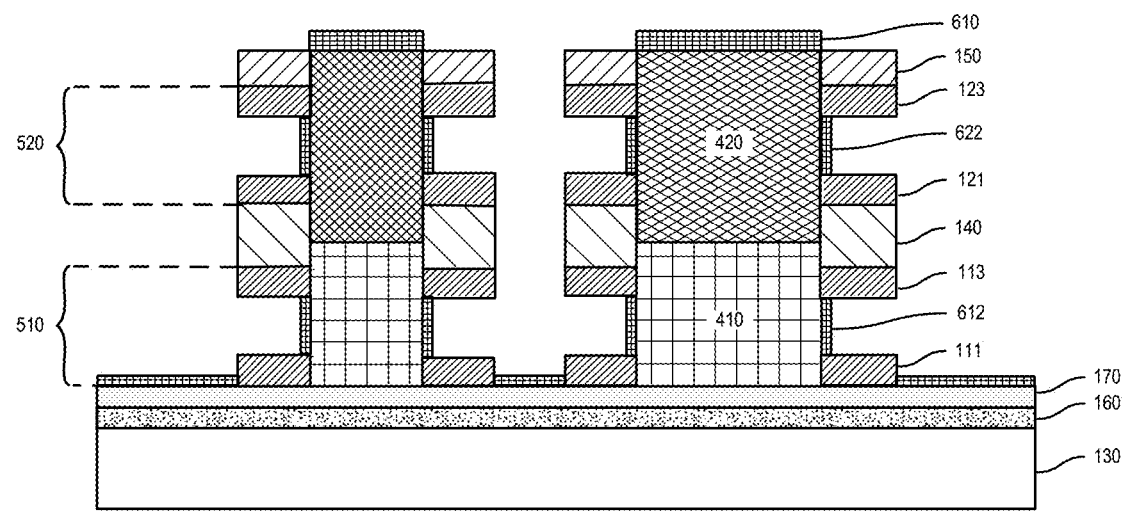

As shown in FIG. 6, the another photoresist mask 530 can be removed to uncover the top of the second dielectric layer stack 120, and the gate dielectric layer 112 of the first dielectric layer stack 110 and the gate dielectric layer 122 of the second dielectric layer stack 120 can be removed to uncover side sections of the first channel 410 and the second channel 420, respectively. For example, the gate dielectric layers 112 and 122 can be removed by isotropic etching, such as vapor-phase etching. As the gate dielectric layer 112 of the first dielectric layer stack 110 and the gate dielectric layer 122 of the second dielectric layer stack 120, which can include the second dielectric material, can be etched selectively with respect to the S/D dielectric layers 111 and 113 of the first dielectric layer stack 110 and the S/D dielectric layers 121 and 123 of the second dielectric layer stack 120, which can include the first dielectric material, and to the transition dielectric layer 140, which can include the third dielectric material, when the gate dielectric layer 112 of the first dielectric layer stack 110 and the gate dielectric layer 122 of the second dielectric layer stack 120 are etched, the S/D dielectric layers 111 and 113 of the first dielectric layer stack 110, the S/D dielectric layers 121 and 123 of the second dielectric layer stack 120 and the transition dielectric layer 140 will not be etched or substantially etched. As also shown in FIG. 6, a high-k dielectric material 610 can be deposited on the uncovered top of the second dielectric layer stack 120 and the uncovered portion of the implant layer 170, and be deposited on the uncovered side sections of the first channel 410 and the second channel 420 to form gate dielectric materials 612 and 622, respectively.

Figure 7:
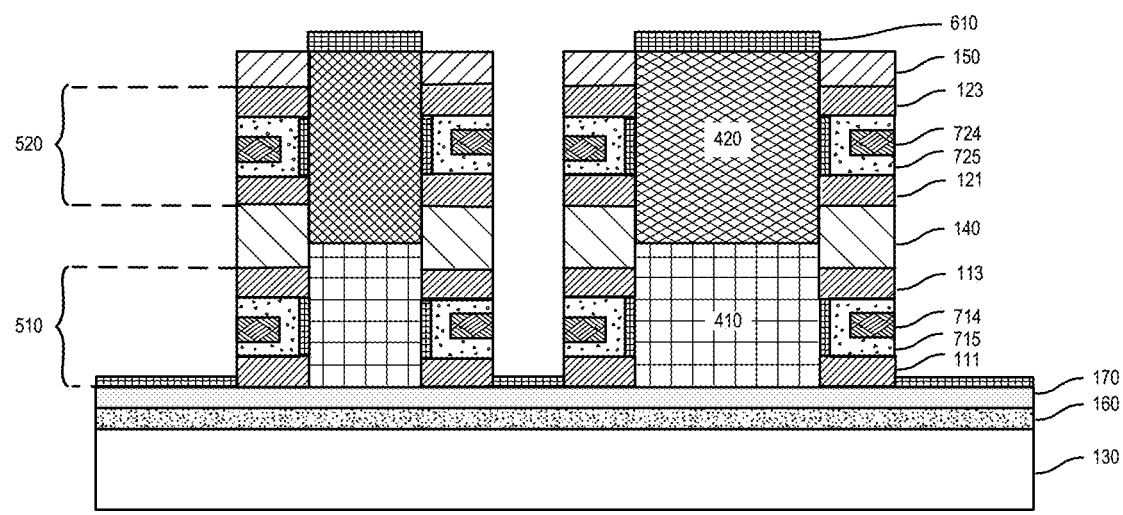

As shown in FIG. 7, metal gate electrodes of the first and second semiconductor devices 510 and 520 can be formed. In an embodiment, the metal gate electrode of the first semiconductor device 510 can include an outer metal material 715 that is blanked deposited on the gate dielectric material 612, the lower S/D dielectric layer 111 and the upper S/D dielectric layer 113, and an inner metal material 714 surrounded by the outer metal material 715. For example, the outer metal material 715 and the inner metal material 714 of the first semiconductor device 510 can include two different metal materials, such as first and second metal materials. In another embodiment, the metal gate electrode of the first semiconductor device 520 can include an outer metal material 725 that is blanked deposited on the gate dielectric material 622, the lower S/D dielectric layer 121 and the upper S/D dielectric layer 123, and an inner metal material 724 surrounded by the outer metal material 725. For example, the outer metal material 725 and the inner metal material 724 of the second semiconductor device 520 can include two different metal materials, such as the first and second metal materials. In an embodiment, each of the outer and inner metal materials can include one or more metal materials, depending on a desired work function required for a particular circuit or transistor.

Figure 8:
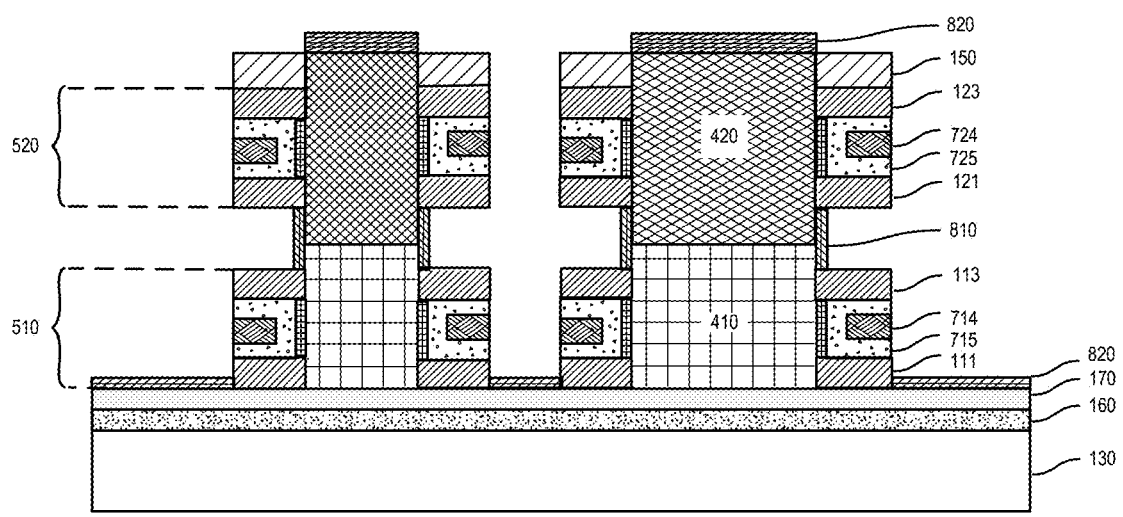

As shown in FIG. 8, the transition dielectric layer 140 can be removed to uncover a portion of the first channel 410 and the second channel 420 that interface at the transition dielectric layer 140, and the high-k dielectric material 610 can also be removed to uncover the top of the second dielectric layer stack 120 and the implant layer 170. As also shown in FIG. 8, salicide metal can then be deposited on the uncovered portion of the first channel 410 and the second channel 420 and the uncovered top of the second dielectric layer stack 120 and the implant layer 170. In an embodiment, the salicide metal can be Ruthenium (Ru), Cobalt (Co), Titanium (Ti), Tungsten (W), Palladium (Pd), Platinum (Pt) or Nickel (Ni). The salicide metal can then react with the uncovered portion of the first channel 410 and the second channel 410 and the uncovered top of the second dielectric layer stack 120 and the implant layer 170 and be annealed to form silicide 810 on the uncovered portion of the first channel 410 and the second channel 410 (i.e., around the uncovered portion of the first channel 410 and the second channel 410, to form a gate-all-around (GAA) structure) and silicide 820 on the uncovered top of the second dielectric layer stack 120 and the implant layer 170. In an embodiment, the unreacted salicide metal can be removed with wet chemistry in non-silicon regions. In an embodiment, the silicide 810 can couple the first semiconductor device 510 to the second semiconductor device 520.

Figure 9A:
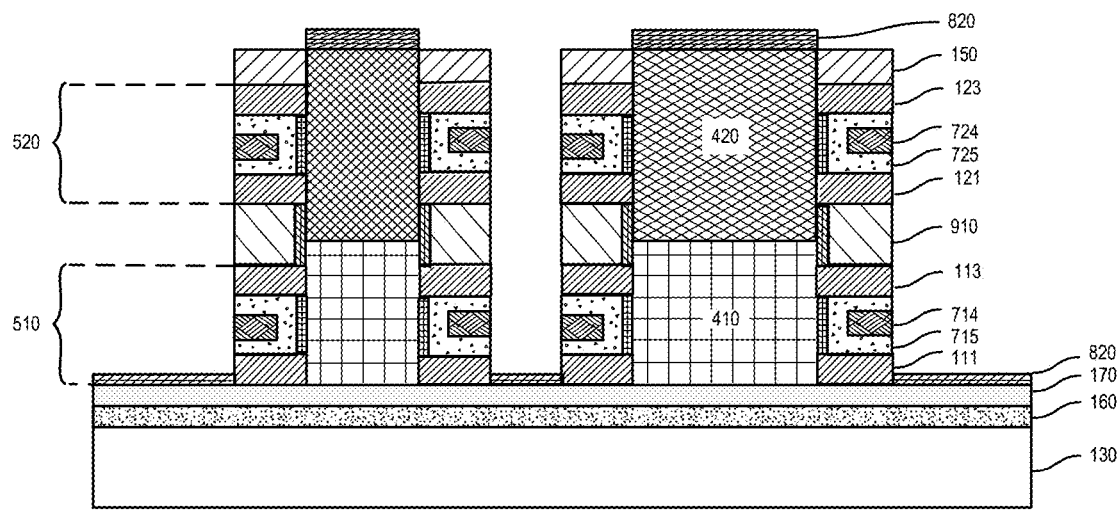
Figure 9B:
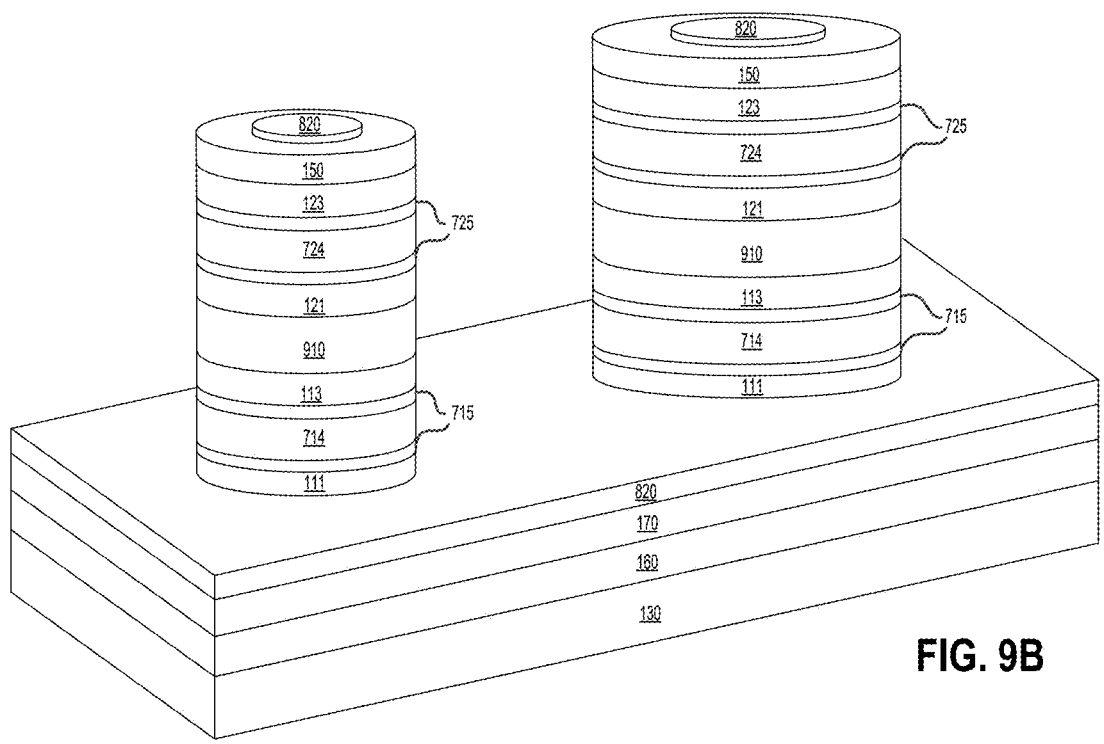
FIG. 9B shows a schematic diagram of the 3D semiconductor apparatus of FIG. 9A.

As shown in FIG. 9A, a transition dielectric material 910 can be deposited on the silicide 810 to protect/isolate the silicide 810, the first channel 410 and the second channel 420 from the gate electrodes for future electrical hook up. In an embodiment, the transition dielectric material 910 can be etched selectively with respect to the first and second dielectric materials. For example, the transition dielectric material 910 can include the third dielectric material. As another embodiment, the transition dielectric material 910 can include a different dielectric material from the first to third dielectric material. FIG. 9B shows a schematic view of the 3D semiconductor apparatus of FIG. 9A. In an embodiment, the silicide 820 and the 3D semiconductor apparatus can have circular cross-sections, as shown in FIG. 9B. In another embodiment, at least one of the silicide 820 and the 3D semiconductor apparatus can have a rectangular cross-section.

Figure 10:
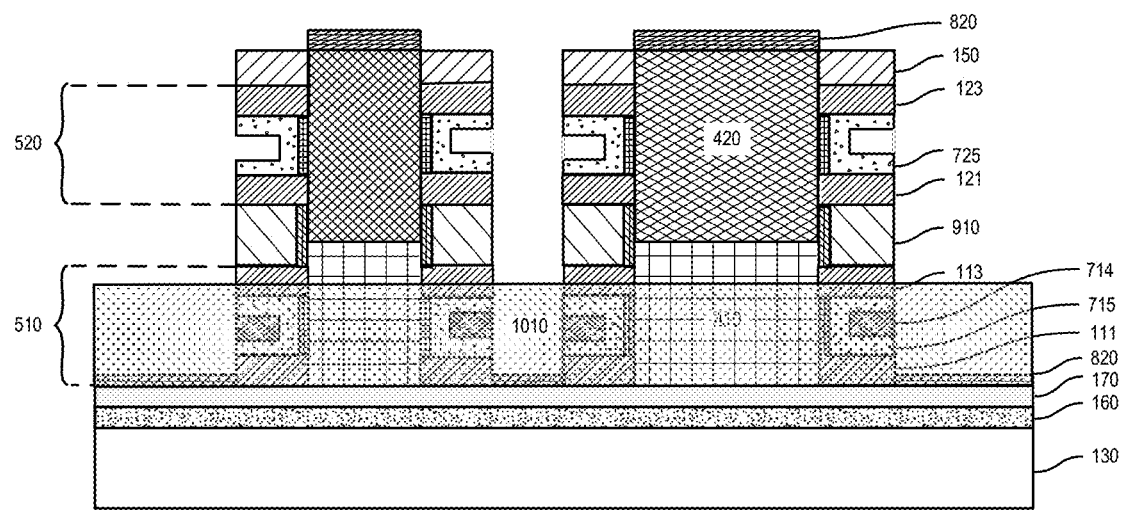

As shown in FIG. 10, a dielectric material 1010 can be deposited to cover the sidewall structures of the first and second semiconductor devices 510 and 520 and the implant layer 170. In an embodiment, the dielectric material 1010 can be etched selectively with respect to the S/D dielectric layers 121 and 123, which include the first dielectric material, and to the transition dielectric layer 910, which includes the third dielectric material. For example, the dielectric material 1010 can include the same dielectric material as the gate dielectric layers 112 and 122, which include the second dielectric material. In an embodiment, overburden can be planarized using chemical-mechanical polishing (CMP). As also shown in FIG. 10, the dielectric material 1010 can then be etched to a depth sufficient to uncover the second semiconductor device 420, while keeping the first semiconductor device 410 and the implant layer 170 being covered. As also shown in FIG. 10, the inner metal material 724 of the second semiconductor device 520 can be removed.

Figure 11:
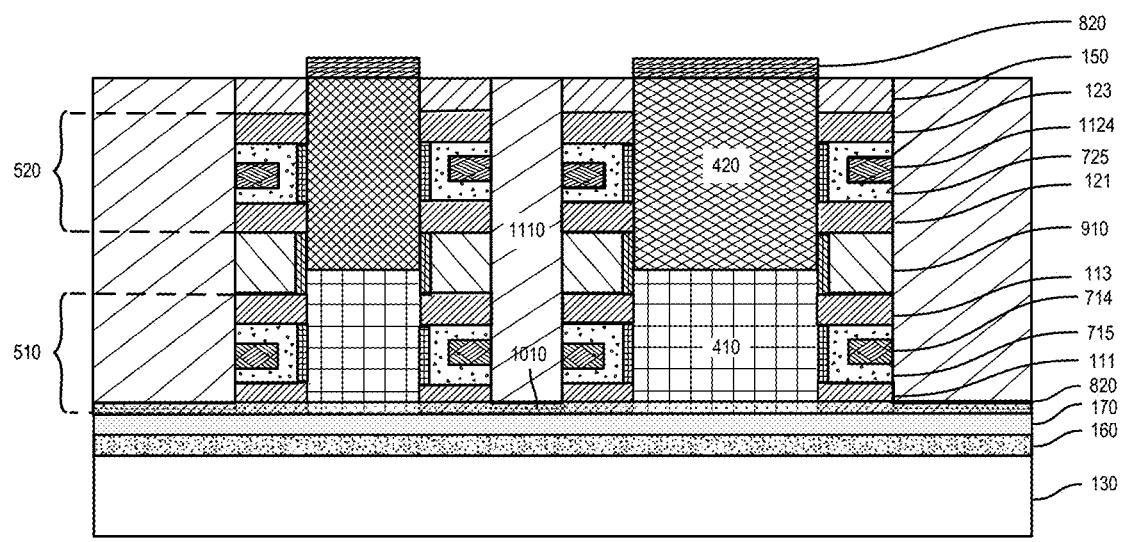

As shown in FIG. 11, the dielectric material 1010 can be further etched to uncover the first semiconductor device 510, while keeping the implant layer 170 still being covered. As also shown in FIG. 11, a third metal material 1110 can be deposited and planarized to form an inner metal material 1124. For example, the third metal material 1010 can include a different metal material from the inner metal material 714 of the first semiconductor device 510. In such a scenario, the inner metal material 1124 and the inner metal material 714 can include different metal materials. In another embodiment, the removal of the inner metal material 724 of the second semiconductor device 520 can be omitted, and the third metal material 1110 can be deposited and planarized with the inner metal material 724 intact, which can then be referred to as the inner metal material 1124 of the second semiconductor device 520. In such a scenario, the inner metal material 1124 of the second semiconductor device 520 and the inner metal material 714 of the first semiconductor device 510 can have the same metal material. In an embodiment, a liner (not shown) can optionally be applied before the deposition of the third metal material 1110.

Figure 12:
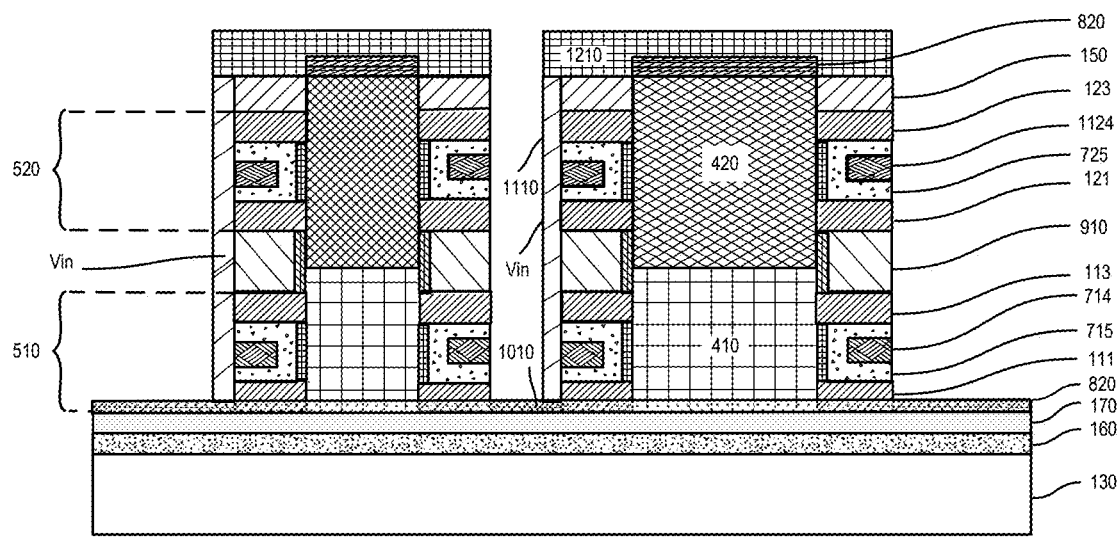

As shown in FIG. 12, an etch mask (e.g., a photoresist mask) 1210 can be patterned and formed, and the third metal material 1110 can be etched to define metal lines that couple the first semiconductor device 510 and the second semiconductor device 520. In an embodiment, Vin can be formed that couples a first gate region (e.g., including the inner metal material 714 and the outer metal material 715) of the first semiconductor device 510 and a second gate region (e.g., including the inner metal material 1124 and the outer metal material 725) of the second semiconductor device 520.

Figure 13:
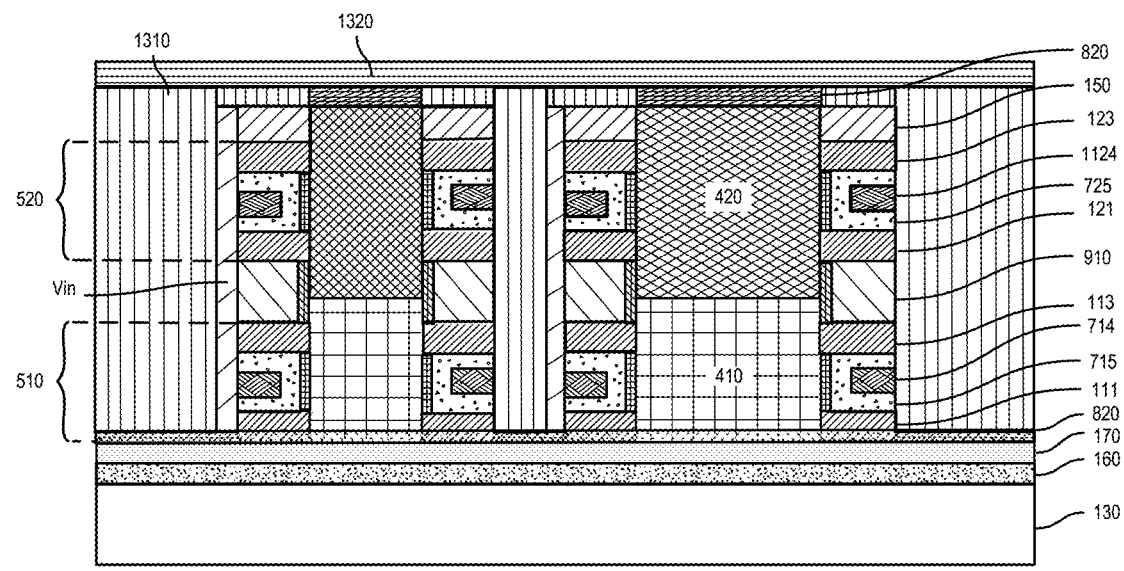

As shown in FIG. 13, the photoresist mask 1210 can be stripped, and then an oxide 1310 can be deposited to fill a space that is formed after the etching of the third metal material 1110 in FIG. 12. In an embodiment, the oxide 1310 can be deposited to level with the top of the silicide 820 formed on the second semiconductor device 520. In another embodiment, the oxide 1310 can include the same dielectric material as the transition dielectric layer 910, e.g., the third dielectric material. As also shown in FIG. 13, the oxide 1310 can be polished, and then a hardmask 1320 can be deposited on the oxide 1310 and the silicide 820 formed on the second semiconductor device 520.

Figure 14:
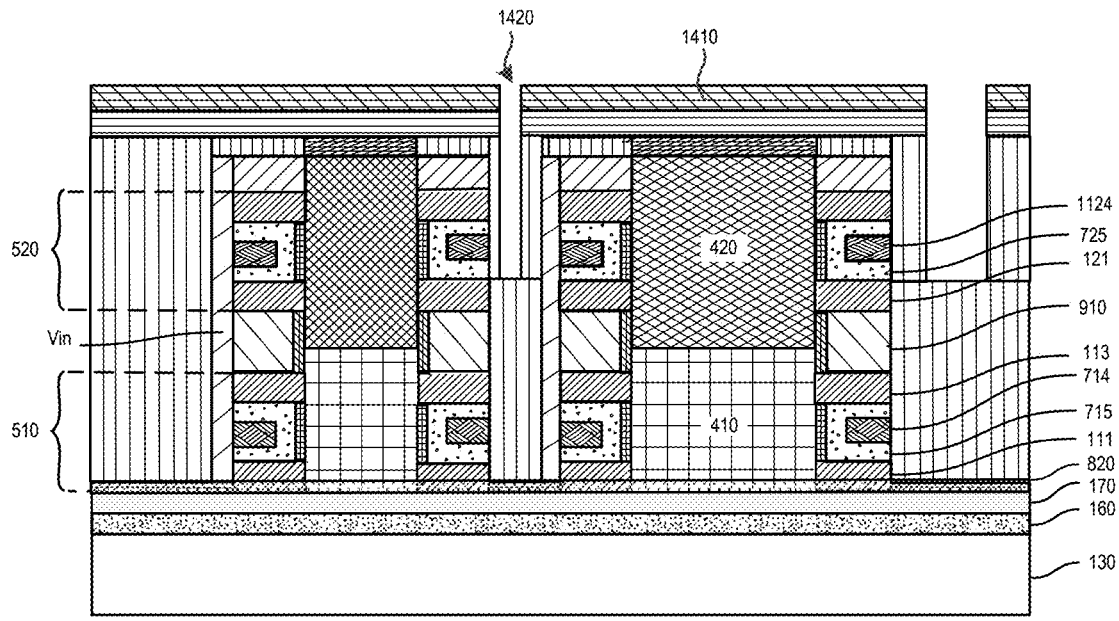

As shown in FIG. 14, an etch mask (e.g., a photoresist mask) 1410 can be patterned and formed, and an opening 1420 can be formed by sequentially etching the hardmask 1320 and the oxide 1310 that are not covered by the etch mask 1410 to a depth approximately leveled with the top of the transition dielectric layer 910 and the silicide 810.

Figure 15:
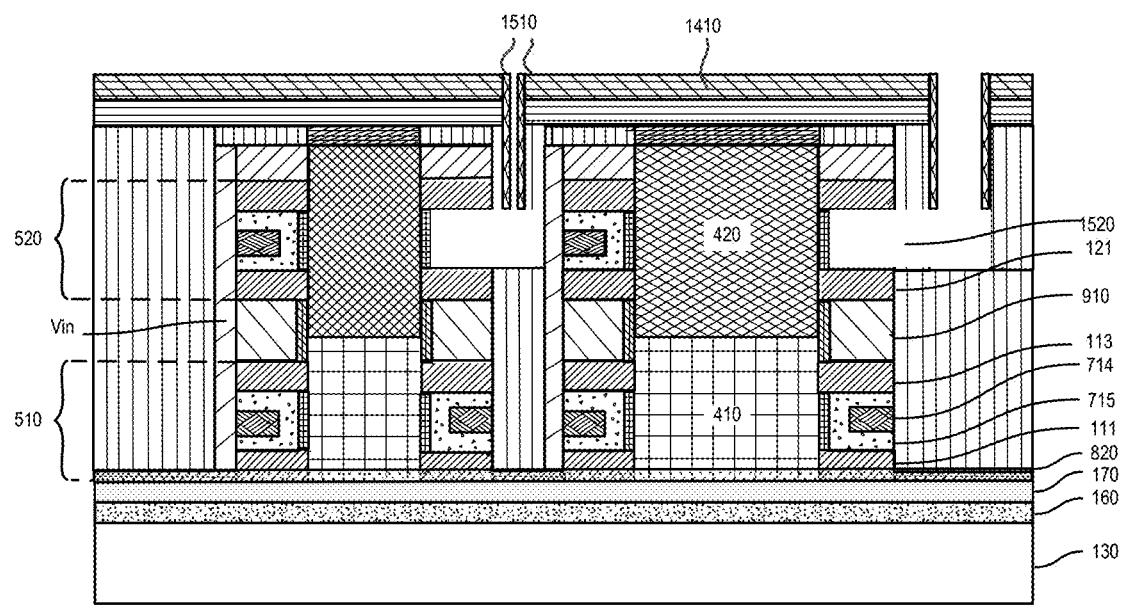

As shown in FIG. 15, the photoresist mask 1410 can be removed, a spacer film 1510 can be deposited on a side section of the opening 1420, and the oxide 1310 sandwiched between the first semiconductor device 510 and the second semiconductor device 520 can be etched to uncover the silicide 810.

Figure 16:
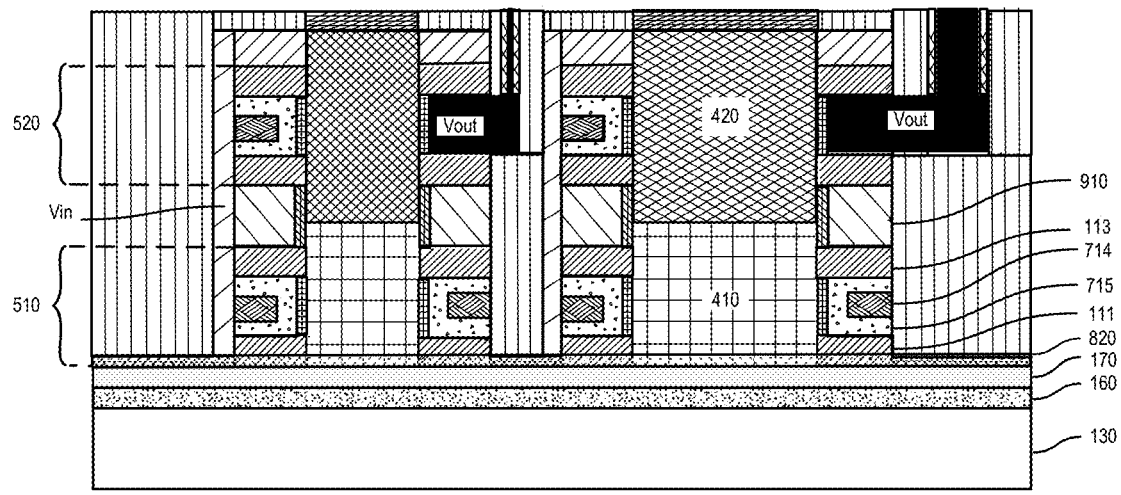

As shown in FIG. 16, a fourth metal material 1610 can be deposited in the opening 1420 to form Vout of the CMOS inverter (i.e., the first semiconductor device 510, which can be a PMOS, and the semiconductor device 520, which can be an NMOS, or vice versa). For example, the fourth metal material 1610 and the third metal material 1110 can include the same metal material. As another example, the fourth metal material 1610 and the third metal material 1110 can include different metal materials. As also shown in FIG. 16, the hardmask 1320 can be removed.

Figure 17:
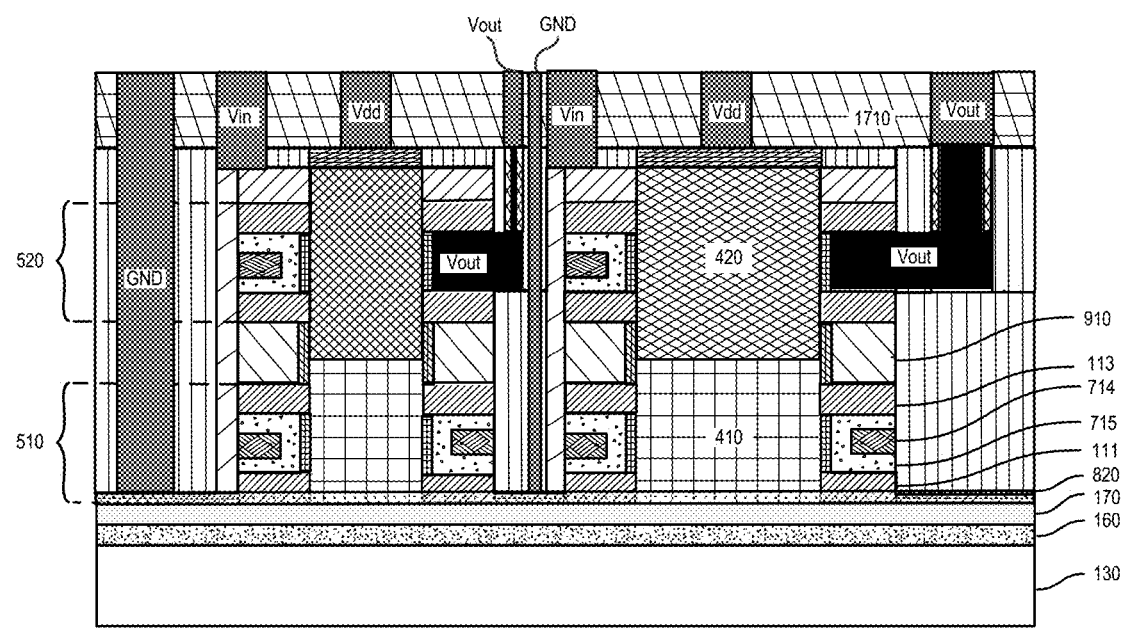

As shown in FIG. 17, Vdd and GND of the CMOS inverter can be formed. In an embodiment, a dielectric material 1710 can be deposited on the second semiconductor device 520, a mask (not shown) can be formed on the dielectric material 1710, openings for the formation of Vdd and GND can be formed in the dielectric material 1710, a metal material can then be deposited to fill the openings to form Vdd and GND, and chemical-mechanical polishing (CMP) can be used to remove the overburden. In an embodiment, GND can be formed next to Vin. In another embodiment, GND can have 360 degree rotational symmetry.

In sum, the 3D semiconductor apparatus (e.g., a 3D CMOS inverter) fabricated by the exemplary method shown in FIGS. 1-17 can include: the first semiconductor device 510 that includes first S/D regions, e.g., the first S/D layers 111 and 113, the first gate region (e.g., including the inner metal material 714 and the outer metal material 715) sandwiched by the first S/D regions 111 and 113, and the first channel 410 surrounded by the first S/D regions 11 and 113 and the first gate region; the second semiconductor device 520 stacked on the first semiconductor device 510 that includes second S/D regions, e.g., the second S/D layers 121 and 123, the second gate region (e.g., including the inner metal material 1124 and the outer metal material 725) sandwiched by the second S/D regions 121 and 123, and the second channel 420 surrounded by the second S/D regions 121 and 123 and the second gate region and formed vertically in-situ on the first channel 410; and the silicide 820 formed between the first semiconductor device 510 and the second semiconductor device 520 where the first channel 410 interfaces with the second channel 420 and coupled to an upper one of the first S/D regions 111 and 113 of the first semiconductor device 510 and a lower one of the second S/D regions 121 and 123 of the second semiconductor device 520. In an embodiment, the first semiconductor device 510 and the second semiconductor device 520 can be of different types. In another embodiment, the first gate region can include a first metal material (e.g., the outer metal material 715) and a second metal material (e.g., the inner metal material 714) surrounded by the first metal material, and the second gate region can include the first metal material (e.g., the outer metal material 725) and a third metal material (e.g., the inner metal material 1124) surrounded by the first metal material. For example, the second and third metal materials can include a same metal material. As another example, the second and third metal materials can include different metal materials.

Figure 18:
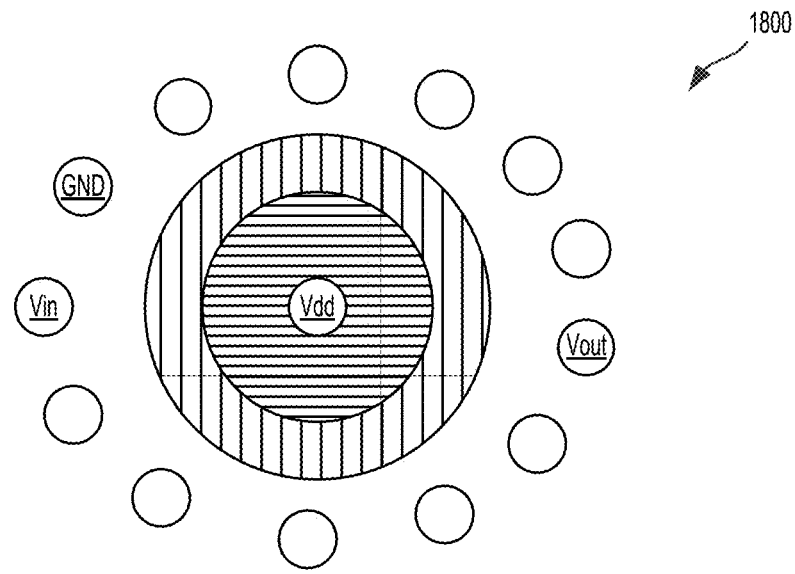
FIG. 18 shows a top view of the 3D semiconductor apparatus according to some embodiments of the present disclosure.

FIG. 18 shows a top view of a 3D semiconductor apparatus 1800 (e.g., a 3D CMOS inverter) fabricated by the method shown in FIGS. 1-17 according to some embodiments of the present disclosure. The CMOS inverter 1800 can have the opening 220/230 that has a circular cross-section, Vdd in the center of the opening 220/230, and Vin, GND and Vout and other contacts that have 360 degree rotational symmetry. For example, Vin can be next to GND. The CMOS inverter 1800 shown in FIG. 18 can have 14 contacts. In an embodiment, the CMOS inverter 1800 can have a different number of contacts, depending on the contact size, for example. Accordingly, many options can be provided for placement and routing of metal connections.

Figure 19:
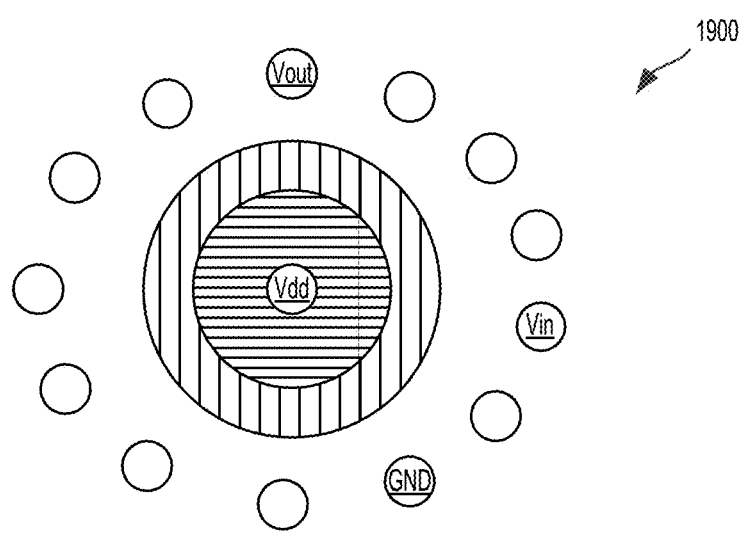
FIGS. 19-21 show top views of three different 3D semiconductor apparatuses fabricated by a method according to various embodiments of the present disclosure.

FIG. 19 shows a top view of a 3D semiconductor apparatus 1900 (e.g., a 3D CMOS inverter) fabricated by the method shown in FIGS. 1-17 according to some embodiments of the present disclosure. The CMOS inverter 1900 can differ from the CMOS 1800 at least in that Vin and GND of the CMOS inverter 1900 are separated from each other.

Figure 20:
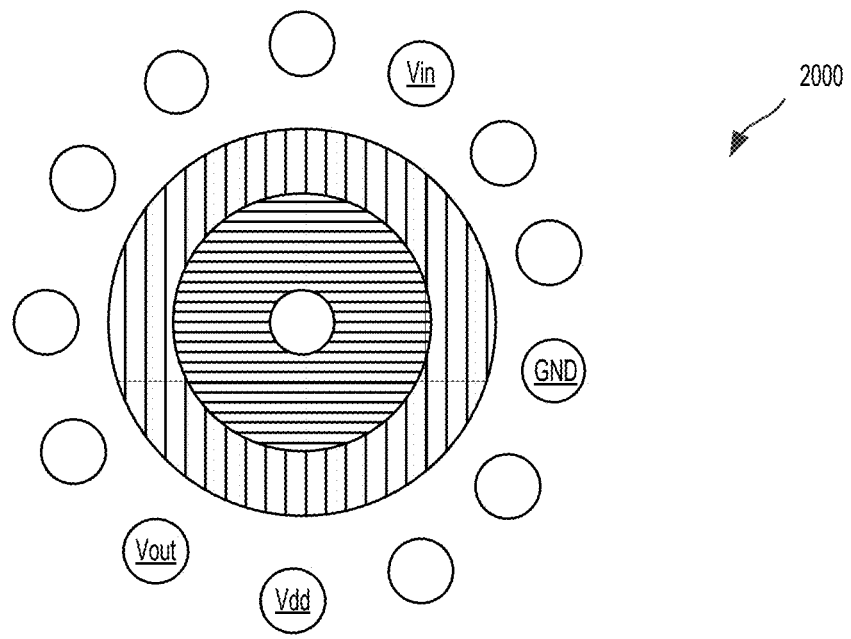

FIG. 20 shows a top view of a 3D semiconductor apparatus 2000 (e.g., a 3D CMOS inverter) fabricated by the method shown in FIGS. 1-17 according to some embodiments of the present disclosure. The CMOS inverter 2000 can differ from the CMOS inverters 1800 and 1900 at least in that Vdd of the CMOS inverter 2000 surrounds the opening 220/230.

Figure 21:
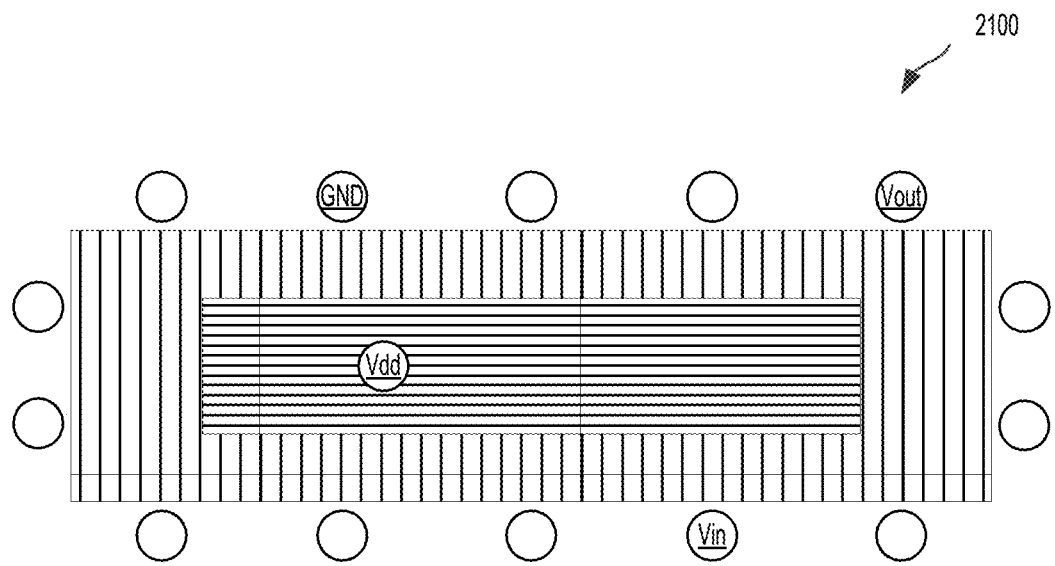

FIG. 21 shows a top view of a 3D semiconductor apparatus 2100 (e.g., a 3D CMOS inverter) fabricated by the method shown in FIGS. 1-17 according to some embodiments of the present disclosure. The CMOS inverter 2100 can differ from the CMOS inverters 1800, 1900 and 2000 at least in that the CMOS inverter 2100 has the opening 220/230 that has a rectangular cross-section.

Figure 22:
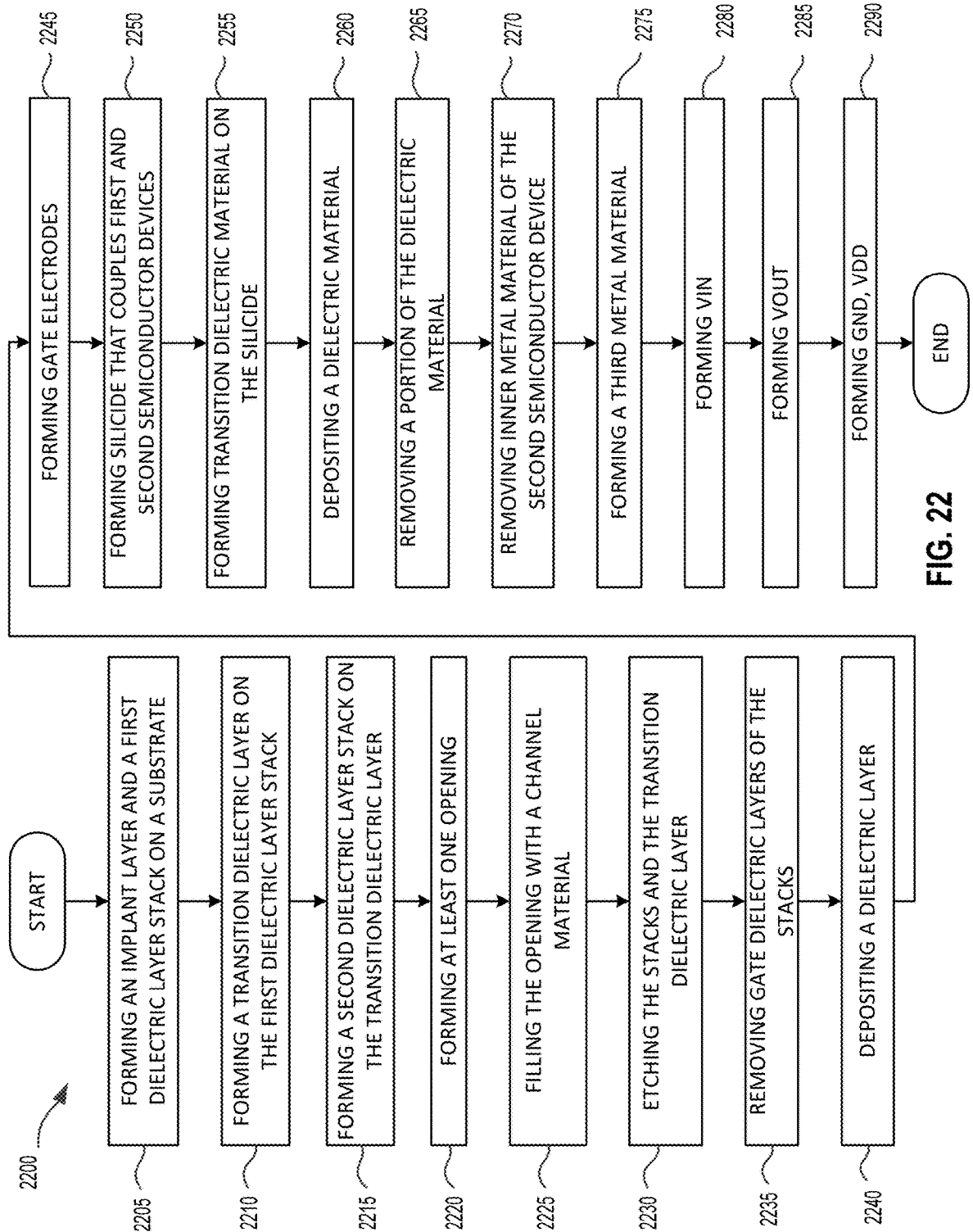
FIG. 22 shows a flow chart of an exemplary method for fabricating a 3D semiconductor apparatus according to some embodiments of the present disclosure.

FIG. 22 shows a flow chart of an exemplary method 2200 for fabricating a 3D semiconductor apparatus according to some embodiments of the present disclosure. For example, the 3D semiconductor apparatus can include a first semiconductor device and a second semiconductor device. In an embodiment, some of the steps of the method 2200 shown can be performed concurrently or in a different order than shown, can be substituted by other method steps, or can be omitted. Additional method steps can also be performed as desired. In another embodiment, the method 2200 can correspond to the method shown in FIGS. 1-17.

At step 2205, an implant layer and a first dielectric layer stack can be formed on a substrate sequentially. In an embodiment, the implant layer can be the implant layer 170, the first dielectric layer stack can be the first dielectric layer stack 110, and the substrate can be the substrate 130, as shown in FIG. 1.

At step 2210, a transition dielectric layer can be formed on the first dielectric layer stack. In an embodiment, the transition dielectric layer can be the transition dielectric layer 140, as shown in FIG. 1.

At step 2215, a second dielectric layer stack can be formed on the transition dielectric layer. In an embodiment, the second dielectric layer stack can be the second dielectric layer stack 120, as shown in FIG. 1.

At step 2220, at least one opening can be formed through the second dielectric layer stack, the transition dielectric layer and the first dielectric layer stack down to the substrate 130. In an embodiment, the at least one opening can include the openings 220 and 230, as shown in FIG. 2.

At step 2225, the opening can be filled with a channel material. In an embodiment, the channel material can include a first channel material and a second channel material. For example, the implant layer 170 can be doped with a first type of dopants, and the first channel material can be epitaxially grown from the implant layer 170 to the transition dielectric layer 140 and doped with the first type of dopants to form the first channel 410, as shown in FIG. 4. As another example, the second channel material can be epitaxially grown from the transition dielectric layer 140 to the top of the second dielectric layer stack 120, and a second type of dopants can be doped into the second channel material to form the second channel 420, as also shown in FIG. 4.

At step 2230, the second dielectric layer stack 120, the transition dielectric layer 140 and the first dielectric layer stack 110 can be etched, as shown in FIG. 5.

At step 2235, gate dielectric layers of the first and second dielectric layer stacks can be removed. In an embodiment, the gate dielectric layer 112 of the first dielectric layer stack 110 and the gate dielectric layer 122 of the second dielectric layer stack 120 can be removed to uncover side sections of the first channel 410 and the second channel 420, respectively, as shown in FIG. 6.

At step 2240, a high-k dielectric material can be deposited. In an embodiment, the high-k dielectric material can be the high-k dielectric material 610, as also shown in FIG. 6.

At step 2245, metal gate electrodes of the first and second semiconductor devices can be formed. In an embodiment, the metal gate electrode of the first semiconductor device 510 can include the outer metal material 715 that is blanked deposited on the dielectric material 612, the lower S/D dielectric layer 111 and the upper S/D dielectric layer 113, and the inner metal material 714 surrounded by the outer metal material 715, as shown in FIG. 7. In another embodiment, the metal gate electrode of the second semiconductor device 520 can include the outer metal material 725 that is blanked deposited on the dielectric material 622, the lower S/D dielectric layer 121 and the upper S/D dielectric layer 123, and the inner metal material 724 surrounded by the outer metal material 725, as also shown in FIG. 7.

At step 2250, silicide that couples the first semiconductor device to the second semiconductor device can be formed. In an embodiment, the silicide can be the silicide 820 that couples the first semiconductor device 510 to the second semiconductor device 520, as shown in FIG. 8.

At step 2255, a transition dielectric material can be deposited on the silicide. In an embodiment, the transition dielectric material can be the transition dielectric material 910 that can be deposited on the silicide 820 and protect/isolate the silicide 810, the first channel 410 and the second channel 420 from the gate electrodes for future electrical hook up, as shown in FIG. 9.

At step 2260, a dielectric material can be deposited to cover sidewall structures of the first and second semiconductor devices. In an embodiment, the dielectric material can be the dielectric material 1010 that covers the sidewall structures of the first and second semiconductor devices 510 and 520 and the implant layer 170, as shown in FIG. 10.

At step 2265, a portion of the dielectric material can be removed. In an embodiment, the dielectric material 1010 can be etched to a depth sufficient to uncover the second semiconductor device 420, while keeping the first semiconductor device 410 and the implant layer 170 being covered, as also shown in FIG. 10.

At step 2270, an inner metal material of the second semiconductor device that is uncovered by the dielectric material can be removed. In an embodiment, the inner metal material can be the inner metal material 724, which is not covered by the etched dielectric material 1010 and can be removed, as also shown in FIG. 10.

At step 2275, a third metal material can be deposited to form an inner metal material. In an embodiment, the third metal material can be the third metal material 1110 that can be deposited and planarized to form the inner metal material 1124, as shown in FIG. 11.

At step 2280, the third metal material can be etched to form metal lines that couple the first semiconductor device to the second semiconductor device. In an embodiment, the third metal material 1110 can be etched to form Vin that couples a first gate region (e.g., including the inner metal material 714 and the outer metal material 715) of the first semiconductor device 510 to a second gate region (e.g., including the inner metal material 1124 and the outer metal material 725) of the second semiconductor device 520, as shown in FIG. 12.

At step 2285, Vout of the 3D semiconductor apparatus (e.g., a 3D CMOS inverter) can be formed. In an embodiment, the oxide 1310 can be deposited to fill a space that is formed after the etching of the third metal material 1110, as shown in FIG. 13; then the hardmask 1320 can be deposited on the oxide 1310 and the silicide 820 formed on the second semiconductor device 520, as also shown in FIG. 13; the photoresist mask 1410 can be patterned and formed and the opening 1420 can be formed by etching the hardmask 1320 and the oxide 1310 that are not covered by the etch mask 1410 to a depth approximately leveled with the top of the transition dielectric layer 910 and the silicide 810, as shown in FIG. 14; the photoresist mask 1410 can be removed, the spacer film 1510 can be deposited on a side section of the opening 1420, and the oxide 1310 sandwiched between the first semiconductor device 510 and the second semiconductor device 520 can be etched to uncover the silicide 810, as shown in FIG. 15; and the fourth metal material 1610 can be deposited in the opening 1420 to form Vout of the CMOS inverter, as shown in FIG. 16.

At step 2290, GND and Vdd can be formed. In an embodiment, the dielectric material 1710 can be deposited on the second semiconductor device 520, the openings for the formation of Vdd and GND can be formed in the dielectric material 1710, the metal material can then be deposited to fill the openings to form Vdd and GND, and chemical-mechanical polishing (CMP) can be used to remove the overburden, as shown in FIG. 17.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating a semiconductor apparatus, comprising:
    forming a multilayer stack on a substrate, the multilayer stack including a plurality of layers of at least three different dielectric materials that are capable of being etched selectively with respect to one another;
    forming at least one opening through the multilayer stack down to the substrate such that the substrate is uncovered;
    forming in the opening a first channel of a first semiconductor device of the semiconductor apparatus vertically from the uncovered substrate and a second channel of a second semiconductor device of the semiconductor apparatus vertically from the first channel;
    removing a transition dielectric layer of the multilayer stack such that a portion of the first channel and the second channel that interfaces at the transition dielectric layer is uncovered; and
    forming a silicide at the uncovered portion to couple the first channel to the second channel.

2. The method of claim 1, wherein the first and second semiconductor devices are of different types.

3. The method of claim 1, wherein the silicide is formed by:
    depositing salicide metal on the uncovered portion of the first channel and the second channel; and
    silicidizing the salicide metal with the uncovered portion of the first channel and the second channel.

4. The method of claim 3, wherein the salicide metal is selected from the group consisting of Ruthenium (Ru), Cobalt (Co), Titanium (Ti), Tungsten (W), Palladium (Pd), Platinum (Pt) and Nickel (Ni).

5. The method of claim 1, wherein the opening has a rectangular or circular cross-section.

6. The method of claim 1, further comprising:
    removing gate dielectric layers of the layers of the multilayer stack and replacing with a gate material to form a first gate region of the first semiconductor device and a second gate region of the second semiconductor device.

7. The method of claim 6, wherein the first and second gate regions are formed by:
    removing the gate dielectric layers to uncover the first and second channels;
    forming a gate dielectric material on the uncovered first and second channels;
    forming a first metal material on the gate dielectric material;
    forming a second metal material that is surrounded by the first metal material adjacent the first channel; and
    forming a third metal material that is surrounded by the first metal material adjacent the second channel.

8. The method of claim 7, wherein at least one of the first and second metal materials includes at least two different metal materials.

9. The method of claim 7, wherein the second and third metal materials include a same metal material.

10. The method of claim 7, wherein forming a gate dielectric material includes forming a gate dielectric material on the first and second channel and the multilayer stack.

11. The method of claim 1, further comprising:
forming an implant layer on the substrate,
wherein the multilayer stack is formed on the implant layer.

12. The method of claim 11, wherein forming a first channel of a first semiconductor device of the semiconductor apparatus vertically from the uncovered substrate and a second channel of a second semiconductor device of the semiconductor apparatus vertically from the first channel includes:
epitaxially growing, within the opening, a first channel material from the implant layer to the transition dielectric layer to form the first channel; and
epitaxially growing, within the opening, a second channel material from the transition dielectric layer to top of the multilayer stack to form the second channel.

13. The method of claim 12, wherein the first channel material and the implant layer are doped with a same type of dopants.

14. The method of claim 1, further comprising:
forming a fourth metal material on the silicide.

15. The method of claim 1, further comprising:
forming silicide on the multilayer stack; and
forming a fifth metal material on the silicide.

16. The method of claim 1, further comprising:
removing second source/drain (S/D) dielectric layers of the layers of the multilayer stack and replacing with a second S/D material to form second S/D regions of the second semiconductor device; and
removing first S/D dielectric layers of the layers of the multilayer stack and replacing with a first S/D material to form first S/D regions of the first semiconductor device.

17. The method of claim 16, wherein the first S/D dielectric layers are capable of being etched selectively with respect to the first S/D dielectric layers.

18. The method of claim 1, further comprising:
etching the multilayer stack to define sidewall structures of the multilayer stack that are around the first and second channels,
wherein removing a transition dielectric layer of the layers of the multilayer stack includes removing a transition dielectric layer of the sidewall structures of the layers of the multilayer stack.

\* \* \* \* \*